United States Patent [19]

Lee et al.

[11] Patent Number: 5,641,540
[45] Date of Patent: Jun. 24, 1997

[54] PREPARATION METHOD FOR LEAD-ZIRCONIUM-TITANIUM BASED THIN FILM

[75] Inventors: Wan-in Lee, Kwachun; Jun-ki Lee, Suwon, both of Rep. of Korea

[73] Assignee: Samsung Electronics Co. Ltd., Suwon, Rep. of Korea

[21] Appl. No.: 415,837

[22] Filed: Apr. 3, 1995

[30] Foreign Application Priority Data

Oct. 10, 1994 [KR] Rep. of Korea ............... 1994-25902
Oct. 10, 1994 [KR] Rep. of Korea ............... 1994-25905

[51] Int. Cl.⁶ ..................................................... C23C 16/40
[52] U.S. Cl. ................................. 427/255.3; 427/248.1
[58] Field of Search ................................. 427/100, 226, 427/248.1, 255.3, 576

[56] References Cited

U.S. PATENT DOCUMENTS

| | | | |
|---|---|---|---|
| 5,139,999 | 8/1992 | Gordon et al. | 505/1 |
| 5,372,850 | 12/1994 | Uchikawa et al. | 427/255.3 |
| 5,431,958 | 7/1995 | Desu et al. | 427/255.3 |

*Primary Examiner*—Shrive Beck
*Assistant Examiner*—Timothy H. Meeks

[57] ABSTRACT

An organometallic zirconium precursor, represented by following formula:

$$L_x Zr(THD)_4 \qquad [I]$$

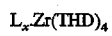

wherein L is an electron donor ligand selected from the group consisting of $NR_3$ (R=H, $CH_3$) gas and $Cl_2$ gas; THD denotes 2,2',6,6'-tetramethyl-3,5-heptanedione; and x is in the range of 0.3 to 1.5 with the proviso that L is $NR_3$ or in the range of 0.5 to 2 with the proviso that L is $Cl_2$, is prepared by flowing a gas phase electron donor into a bubbler containing bis (2,2',6,6'-tetramethyl-3,5-heptanedione)Zr at a predetermined temperature, to synthesize, in-situ, an adduct. The precursor exhibits a remarkable improvement in volatility, and in stability at the vaporization point.

Lead-zirconium-titanium thin films prepared from the precursor, display superior reproducibility and reliability.

7 Claims, 2 Drawing Sheets

PREPARATION METHOD FOR LEAD-ZIRCONIUM-TITANIUM BASED THIN FILM

BACKGROUND OF THE INVENTION

1. Field of the invention

The present invention relates, in general, to a novel organometallic zirconium precursor and its in-situ synthesis and, more particularly, to an organometallic zirconium precursor with an improvement in volatility. Also, the present invention is concerned with a lead-zirconium-titanium thin film using the same and with a preparation method for preparing the same.

2. Description of the Prior Art

Lead-zirconium-titanium ($PbZr_xTi_{1-x}O_3$) thin films or its related thin films (hereinafter referred to as "PZT thin films"), used as ferroelectric thin films for semiconductor capacitors, are prepared from organometallic precursor sources, e.g. lead source, zirconium source and titanium source. For production of the PZT thin films, there is generally used a metal-organic chemical vapor deposition process (hereinafter referred to as "MOCVD"), a technique for growing thin layers of compound semiconductors. In practice, MOCVD comprises preheating a liquid or solid of organometallic precursor to vaporize it and decomposing the vapor by heat or plasma, to deposit a thin film.

It is necessarily required that appropriate organometallic precursors be selected in order to obtain desired properties and quality of the PZT thin film. The following are the general conditions that organometallic precursors should have: first, organometallic precursors should be able to be easily volatilized at low preheat temperatures, in addition to being stable at the preheat temperatures; second, the difference between the vaporization temperature and the decomposition temperature should be large enough; third, it is preferred that the organometallic precursors are not decomposed or changed by the moisture contained in air; finally, they should not be environmentally toxic.

Of the various organometallic precursors useful for preparing the PZT thin films, organometallic Ti precursors and organometallic Pb precursors are relatively well developed and may be volatilized at relatively low temperatures. By contrast, organometallic Zr precursors are disadvantageous in that they are very hygroscopic or difficult to volatilize.

Conventionally, it is tetra (2,2',6,6'-tetramethyl-3,5-heptanedione) zirconium (hereinafter referred to as "Zr(THD)$_4$") that is the most useful in providing a zirconium source for PZT thin films. Zr(THD)$_4$ exhibits outstanding thermal stability that it is not decomposed at up to 300° C. In addition, Zr(THD)$_4$ is very resistant to moisture, unlike other Zr precursors. However, this Zr source for PZT thin film has a vaporization temperature that is much higher than those of the other sources, Pb and Ti sources. In other words, the gap in vaporizing point between the Zr source and the other sources is large. For example, Zr(THD)$_4$ is volatilized at a temperature of about 220° to 240° C. whereas Pb(THD)$_2$ and Ti(OCH$_2$CH$_3$)$_4$ (hereinafter referred to as "Ti(OEt)$_4$") have a vaporizing point of about 140° to 160° C. and about 110° to 120° C., respectively.

Accordingly, it is difficult to control the temperature of a premixing chamber or preheat tube in which volatilized Pb, Ti and Zr precursors are mixed just before entering a reactor. For example, if the preheat temperature is controlled for the Pb or Ti precursor, the gas phase Zr(THD)$_4$ is highly apt to be solidified. On the other hand, if the preheat temperature is raised for the Zr precursor, the Pb and Ti precursors are decomposed or changed before entering the reactor. Further, preheating to the high temperature of around 250° C. lays great restraint on selection of materials for bubbler or valve sealing. Consequently, in spite of superior thermal stability and moisture resistance, Zr(THD)$_4$ is disadvantageous because of its low volatility.

SUMMARY OF THE INVENTION

Therefore, a primary object of the present invention is to overcome the above problems encountered in the prior art and to provide a novel organometallic zirconium precursor, improved in volatility and in stability at its vaporizing point.

It is another object of the present invention to provide a method for synthesizing the organometallic zirconium precursor by a in-situ process.

It is a further object of the present invention to provide a lead-zirconium-titanium thin film made of an organometallic zirconium precursor, which is superior in reliability and reproducibility.

Based on intensive and through research and study by the present inventors, the above objects are accomplished by providing an organometallic zirconium precursor for ferroelectric lead-zirconium-titanium thin film, represented by the following Formula I:

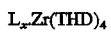
$$L_x Zr(THD)_4 \qquad [I]$$

wherein L is an electron donor ligand selected from the group consisting of NR$_3$ (R=H, CH$_3$) gas and Cl$_2$ gas; THD denotes 2,2',6,6'-tetramethyl-3,5-heptanedione; and x is in the range of 0.3 to 1.5 with the proviso that L is NR$_3$ (R=H, CH$_3$) or in the range of 0.5 to 2 with the proviso that L is Cl$_2$.

In accordance with another aspect of the invention, there is provided a method for the preparation of organometallic zirconium precursor, comprising flowing an electron donor in gas phase into a bubbler containing bis (2,2',6,6'-tetramethyl-3,5-heptanedione)Zr at a predetermined temperature, to synthesize, in-situ, an adduct represented by the above formula.

In accordance with a further aspect of the invention, there is provided a method for the deposition of lead-zirconium-titanium thin film, comprising the steps of: flowing an electron donor in the gas phase into a bubbler containing bis (2,2',6,6'-tetramethyl-3,5-heptanedione)Zr at a selected reaction temperature, to synthesize, in-situ, an adduct represented by the above formula; cooling the adduct to solidify it; heating the bubbler to a temperature lower than said reaction temperature, to volatilize the adduct; passing the adduct with a carrier gas into a metal-oxide vapor deposition reactor; and reacting the volatilized adduct with a titanium precursor source and a lead precursor source, at a high temperature and at reduced pressure in an oxidative atmosphere by metal-oxide chemical vapor deposition.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE INVENTION

Figure 1:
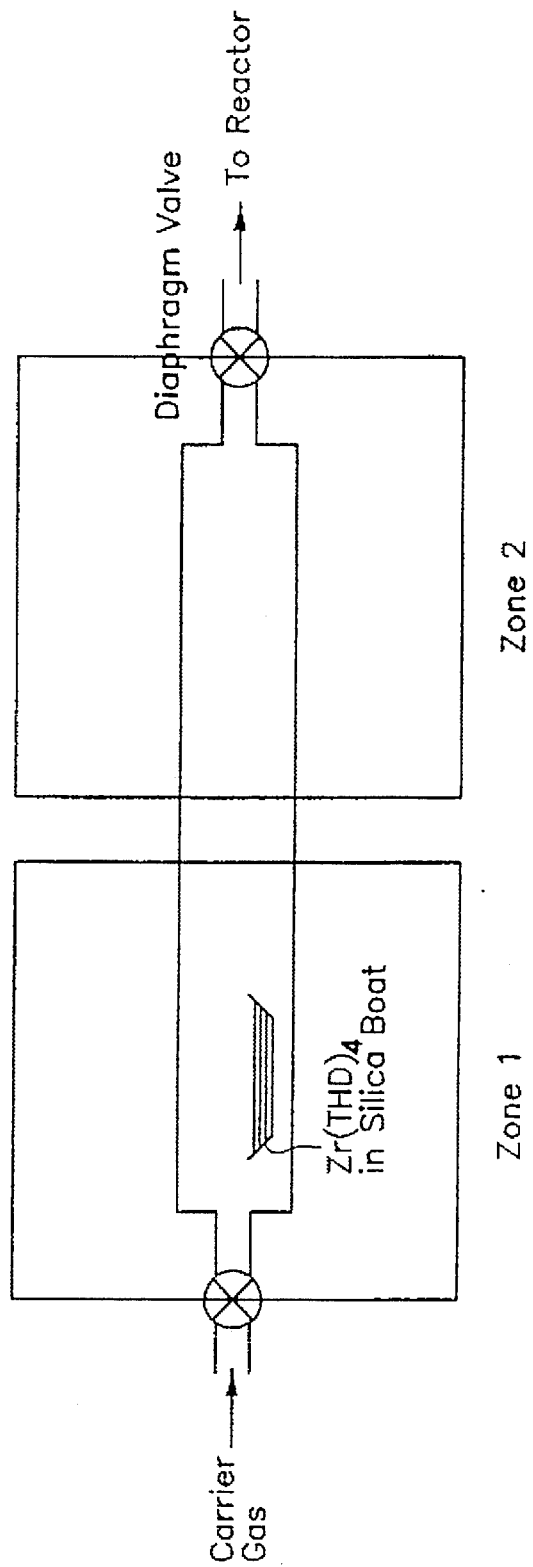
FIG. 1 is a schematic longitudinal section showing bubbler equipment useful to synthesize an organometallic lead precursor of the present invention by an in-situ process.

In a $Zr(THD)_4$ molecule, $Zr(IV)$, the central atom, is coordinately bonded with THD, the ligands, by incorporation of the electrons on the carbonyl groups of the ligands into the bonding sphere of the metal. Generally, THD, which is a neutral ligand without nominal charge, cannot donate sufficient electrons to the Zr atom. Accordingly, the electrophilic Zr atom comes to attractively interact with the THD ligands of neighboring $Zr(THD)_4$ molecules. As a result, $Zr(THD)_4$ molecules form a stable solid structure at room temperature.

On the other hand, coordination bonding of the Zr atom with additional ligands capable of donating sufficient electrons results in weakening or breaking the intermolecular interaction in the solid structure. The coordinated $Zr(THD)_4$ molecules are able to volatilize at lower temperatures than original $Zr(THD)_4$.

In accordance with the present invention, $NR_3$ (R=H, $CH_3$) or $Cl_2$ molecules are utilized as the additional electron donor. Since the $NH_3$ or $Cl_2$ molecule has lone electron pairs, it can supply sufficient electrons to the central atom. In addition, such additional electron donors are relatively small in size, so that they can easily contact with the Zr atom. Therefore, the $NR_3$ (R=H, $CH_3$) or $Cl_2$ electron donor itself can be chemically adducted to $Zr(THD)_4$, as represented by the following reaction formulas:

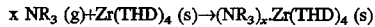

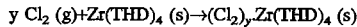

wherein R is H or $CH_3$, x is in the range of 0.3 to 1.5 and y is in the range of 0.5 to 2. In the $NR_3$ (R=H, $CH_3$) or $Cl_2$ adduct, the additional electron donors break the intermolecular interaction among $Zr(THD)_4$ molecules, so that the adduct can be volatilized sufficiently at low temperatures, for example, about 110° to about 170° C., relative to the vaporizing point of $Zr(THD)_4$, about 220° to 240° C. Thus, the obtained adduct can be utilized as an organometallic zirconium precursor with a remarkable improvement in volatility.

In accordance with the present invention, the organometallic zirconium precursor is prepared by a characteristic method comprising flowing a gas phase electron donor into a bubbler containing $Zr(THD)_4$ at a predetermined temperature, to synthesize, in-situ, an adduct represented by the following formula:

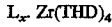

wherein L is an electron donor ligand selected from a group
consisting of $NR_3$ (R=H, $CH_3$) and $Cl_2$; and
x is in the range of 0.3 to 1.5 with the proviso that
L is $NR_3$ (R=H, $CH_3$), or x is in the range of 0.5 to 2 with the proviso that L is $Cl_2$.

The gas phase electron donor used to prepare the organometallic lead precursors of the present invention is selected from the group consisting of $NR_3$ (R=H, $CH_3$) and $Cl_2$.

A more detailed description for the preparation of the present organometallic zirconium precursors will be given as follows.

For the preparation of $(NR_3)_x \cdot Zr(THD)_4$ (R=H or $CH_3$) by an in-situ process, solid phase $Zr(THD)_4$ is placed in the bubbler, and $NR_3$ (R=H or $CH_3$) gases are used as a carrier gas. The temperature of the bubbler is kept to 120°–170° C. $Zr(THD)_4$ in the bubbler reacts with $NR_3$ (R=H or $CH_3$) carrier gas, and $(NR_3)_x \cdot Zr(THD)_4$ (R=H or $CH_3$, $0.3 \leq x \leq 1.5$) is synthesized. The produced chemical species are so volatile that they are vaporized instantly at the bubbler temperature of 120° to 170° C. Vaporized $(NR_3)_x \cdot Zr(THD)_4$ is carried by unreacted electron donor gases ($NH_3$ or $N(CH_3)_3$), and can be used for the thin film deposition in the reactor. Consequently, by simply flowing $NR_3$ (R=H or $CH_3$) as carrier gas, $Zr(THD)_4$ precursor can be easily vaporized at a temperature of 120° to 170° C. This bubbling temperature is considerably lower than that of conventional process, which uses $Zr(THD)_4$ as precursor and Ar or $N_2$ as carrier gas. Therefore, there is no decomposition of precursor during the bubbling process and a constant vapor pressure can be maintained over an elapsed bubbling time.

For preparation of solid phase $(Cl_2)_x \cdot Zr(THD)_4$, $Zr(THD)_4$ is placed in the silica boat as shown in FIG. 1 and then, an electron donor in the gas phase ($Cl_2$) is supplied under the control of a Mass Flow controller. At an elevated temperature, an adduct between $Zr(THD)_4$ and $Cl_2$ is synthesized in the gas phase. As for the reaction conditions, the temperature of Zone 1 is maintained in the range of about 200° to about 240° C. for $(Cl_2)_x \cdot Zr(THD)_4$, whereas the temperature of Zone 2 is maintained at room temperature. At this temperature ranges, $Cl_2$ gas reacts with $Zr(THD)_4$ rapidly. The gas phase adducts $((Cl_2)_x \cdot Zr(THD)_4)$ resulting from the high temperature reaction are solidified in Zone 2 because the wall of the tube in Zone 2 is cooled to room temperature. Since $Cl_2$ gases are instantly reacted with $Zr(THD)_4$ under these conditions, the amount of synthesized adduct can be calculated on the basis of the amount of charged $Zr(THD)_4$ in Zone 1. Meanwhile, unreacted electron donor gas is not passed into a reactor connected to the tube of Zone 2, but drained through a bypass and removed through reaction with an aqueous NaOH solution. Then, the carrier gas is replaced with $N_2$ and the bubbler temperature is adjusted to 110° to 160° C., which is greatly lower than the temperature of the conventional process.

Figure 2:
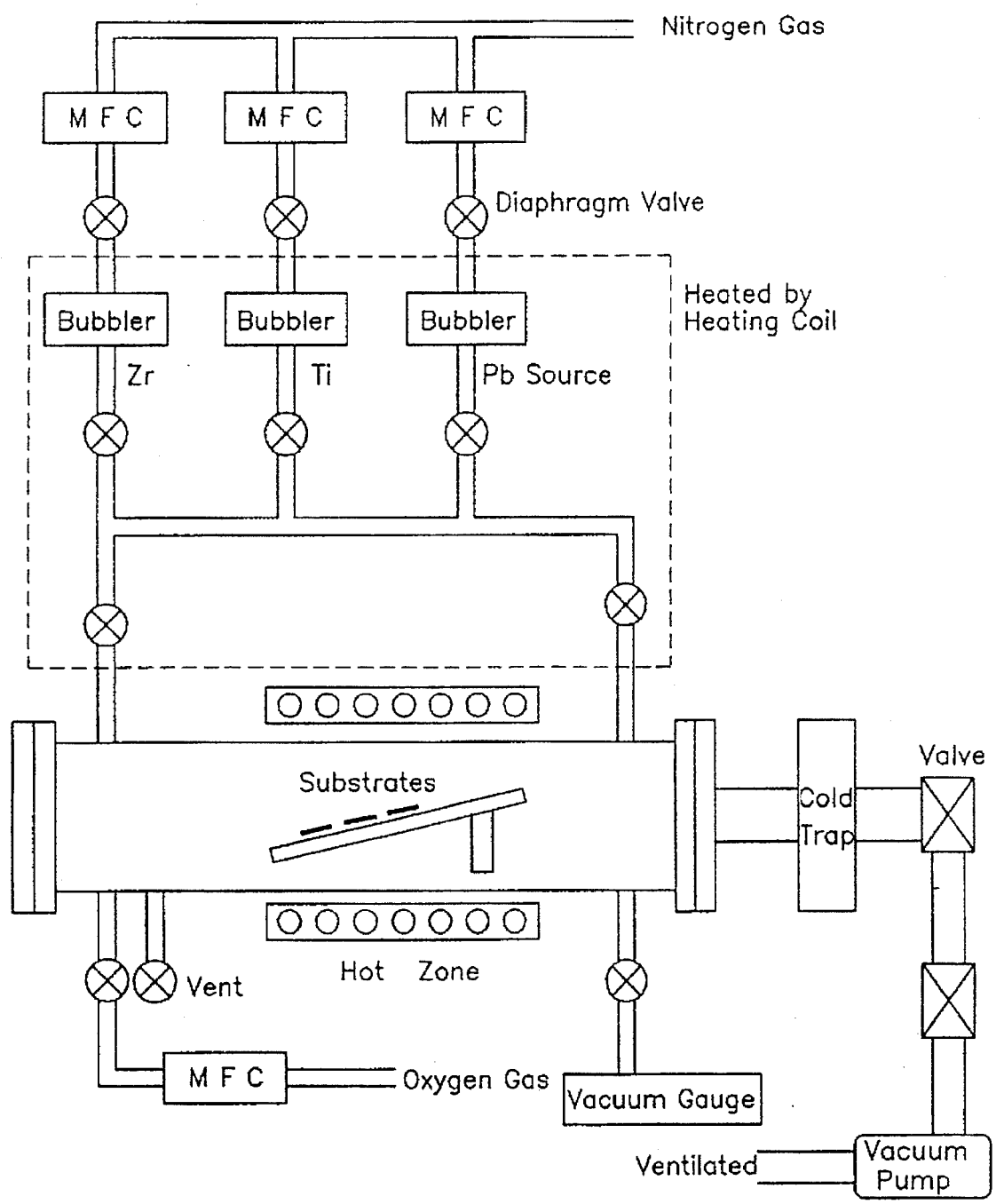
FIG. 2 is a schematic view showing an MOCVD apparatus useful for preparing a lead-titanium based thin film from the organometallic lead precursor of the present invention.

Referring now to FIG. 2, there is shown an MOCVD apparatus useful to deposit PZT thin films. As shown in this figure, this MOCVD apparatus, which is a kind of a low pressure CVD apparatus operating in a hot wall manner, is provided with bubbler equipment for precursor sources, e.g. a Pb source, a Zr source and a Ti source, a reactor and a cold trap.

For the deposition of a PZT thin film by using $NR_3$ (R=H, $CH_3$) adducted $Zr(THD)_4$, $Zr(THD)_4$ is first charged into a bubbler. Then, the temperature of bubbler is adjusted to 120°–170° C. and $NR_3$ gas with a flow rate of 50–100 sccm is employed. The in-situ generated $(NR_3)_x \cdot Zr(THD)_4$ is carried to a reactor by the $NR_3$, which is not consumed in the reaction with $Zr(THD)_4$. For the Ti source, $Ti(OEt)_4$ is typically used, and it is heated to 100 –125° C., while 10–20 sccm of $N_2$ gas is preferably used as a carrier gas. For the Pb source, $Pb(THD)_2$ is used, and it is heated to 140°–160° C., while 50 sccm of $N_2$ gas is preferably used as a carrier gas.

For the deposition of a PZT thin film by using chlorine-adducted $Zr(THD)_4$, first, the prepared $(Cl_2)_x \cdot Zr(THD)_4$ in Zone 2 of the bubbler of FIG. 1 is first heated to 110°–160° C. In order to carry the vaporized chlorine-adducted $Zr(THD)_4$, $N_2$ gas with a flow rate of 50–100 sccm is employed. In the same way, for the Ti source, $Ti(OEt)_4$ is typically used, and it is heated to 100°–125° C., while 10–20 sccm of $N_2$ gas is preferably used as a carrier gas. For the Pb source, $Pb(THD)_2$ is used, and it is heated to 140°–160° C., while 50 sccm of $N_2$ gas is preferably used as a carrier gas.

Thereafter, the vaporized precursor sources are decomposed in the reactor heated to high temperatures, for example, about 550° to about 650° C. and then, reacted with oxygen gas which is provided from another regulated route, for deposition of PZT thin film on a substrate. For $PbZr_xTi_{1-x}O_3$ thin film, the oxygen gas is flowed in a rate of 500 sccm. The cold trap which is connected with the reactor, in the meanwhile, removes unreacted precursor sources. A vacuum pump works to maintain a reduced pressure in the reactor.

The preferred embodiments of the present invention will now be further described with reference to specific examples.

EXAMPLE 1

The MOCVD apparatus of FIG. 2 was used to deposit a PZT thin film.

First, 1.5 g of $Zr(THD)_4$ was charged in a stainless tube of the bubbler and heated to about 160° C. Then, when the bubbler temperature was stabilized, a dry ammonia gas was flowed in a rate of 100 sccm. The $(NH_3)_x\cdot Zr(PHD)_4$ adduct thus produced was carried into the reactor by unreacted $NH_3$ gas.

Separately, 10 g of $Ti(OEt)_4$ and 1 g of $Pb(THD)_2$ were charged in respective bubblers and the temperatures in the Ti and Pb bubbler were raised to about 115° C. and about 155° C., respectively. The Ti source was supplied to the reactor by a carrier gas of $N_2$ with a flow rate of about 15 sccm, whereas the Pb source was supplied by the same carrier gas of $N_2$ with a flow rate of 50 sccm. Then, the reactor was heated to about 600° C., to deposit the PZT thin film.

More detailed reaction conditions are reported in the following Table I.

TABLE I

Deposition Conditions for PZT

| | Reaction Condition | | |
|---|---|---|---|
| Item | Pb source | Ti source | Zr source |
| Precursor | $Pb(THD)_2$ | $Ti(OEt)_4$ | $Zr(THD)_4$ |
| Temp. in Bubbler | 110° C. | 115° C. | 160° C. |
| Carrier Gas | $N_2$ | $N_2$ | $NH_3$ |
| Flow Rate of Carrier Gas | 50 sccm | 15 sccm | 100 sccm |
| Oxygen Flow Rate | | 500 sccm | |
| Temp. & Pressure in Reactor | | 600° C., 2.0 torr | |

Under the conditions given in Table I, the reactor was operated for 30 minutes, to obtain a PZT thin film of perovskite phase with a thickness of 300 nm.

EXAMPLE II $(Cl_2)_x\cdot Zr(THD)_4$ was synthesized using the bubbler equipment of FIG. 1.

For this, a quartz boat containing 1.5 g of $Zr(THD)_4$ was positioned in Zone 1. Zone 1 was heated to 220° C. and Zone 2 was maintained in room temperature by circulating cold water around Zone 2. Dry chlorine gas flowed in a rate of 50 sccm for 20 minutes and was consumed by reaction with $Zr(THD)_4$ positioned in Zone 1. The gas phase adduct thus produced, $(Cl_2)_x\cdot Zr(THD)_4$, was solidified in Zone 2, cold region.

Thereafter, Example 1 was repeated using the deposition conditions given in the following Table II. Particularly, the carrier gas for the Zr source was replaced by nitrogen gas in this Example.

TABLE II

Deposition Conditions for PZT

| | Reaction Condition | | |
|---|---|---|---|
| Item | Pb source | Ti source | Zr source |
| Precursor | $Pb(THD)_2$ | $Ti(OEt)_4$ | $(Cl_2)_x\cdot Zr(THD)_4$ |
| Temp. in Bubbler | 155° C. | 115° C. | 160° C. |
| Carrier Gas | $N_2$ | $N_2$ | $N_2$ |
| Flow Rate of Carrier Gas | 50 sccm | 15 sccm | 100 sccm |
| Oxygen Flow Rate | | 500 sccm | |
| Temp. & Pressure in Reactor | | 600° C., 2.0 torr | |

Under such conditions, the reactor was operated for 30 minutes, to obtain a PZT thin film of perovskite phase with a thickness of 300 nm.

The following are the advantages obtained when the organometallic zirconium precursors of the present invention, $(NR_3)_x\cdot Zr(THD)_4$ (R=H, $CH_3$) and $(Cl_2)_x\cdot Zr(THD)_4$, are used for PZT thin films.

First, it is possible to obtain a PZT thin film superior in reliability and reproducibility, since the above precursors can be used repetitively in a bubbler without any decomposition.

Second, the precursors of the present invention are able to be vaporized at much lower temperatures than is $Zr(THD)_4$.

Third, the precursors of the present invention are very stable at the preheat temperatures for vaporization.

Fourth, since $(NR_3)_x\cdot Zr(THD)_4$ (R=H, $CH_3$) and $(Cl_2)_x\cdot Zr(THD)_4$ are hygroscopic, there is a danger that these precursors decompose during treatment if they are prepared outside the bubbler and then delivered into the bubbler. In the present invention, the above danger is eliminated because the precursors are synthesized in the bubbler in-situ.

Finally, $N_2$ gas, which is utilized as a carrier gas for $(Cl_2)_x\cdot Zr(THD)_4$ precursor prevents corrosion or damage to the reactor.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed herein.

The expression "PZT thin films", or "lead-zirconium-titanium thin film", as used in the specification denotes $Pb(ZrTi)O_3$ (PZT) and doped $Pb(ZrTi)O_3$ (PZT), such as $Pb(NbZrTi)O_3$ (PNZT), $Pb(LaZrTi)O_3$ (PLZT), $Pb(TaZrTi)O_3$ (PTZT) and $Pb(ScZrTi)O_3$ (PSZT).

What is claimed is:

1. A method for the deposition of lead-zirconium-titanium thin film, comprising the steps of:

flowing a gas phase electron donor into a bubbler containing bis(2,2',6,6'-tetramethyl-3,5-heptanedione)Zr at a selected reaction temperature, to synthesize, in-situ, a gas phase adduct represented by the following formula III:

$$L_x\cdot Zr(THD)_4 \qquad \text{[III]}$$

wherein
- L is an electron donor ligand selected from the group consisting of $NR_3$, wherein R is hydrogen or methyl, and $Cl_2$;
- THD denotes 2,2',6,6'-tetramethyl-3,5-heptanedione; and
- x is in the range of 0.3 to 1.5 when L is $NR_3$, or x is in the range of 0.5 to 2 when L is $Cl_2$;

cooling the adduct to solidify it;

heating the bubbler to a temperature lower than said selected reaction temperature, to volatilize the adduct;

passing the adduct with a carrier gas into a metal-oxide vapor deposition reactor; and reacting the volatilized adduct with a titanium precursor source and a lead precursor source in an oxidative atmosphere to achieve vapor deposition of a lead-zirconium-titanium thin film.

2. A method in accordance with claim 1, wherein L is $NR_3$, R is hydrogen or methyl, and said selected reaction temperature is in the range of from about 120° to about 170° C.

3. A method in accordance with claim 1, wherein L is $Cl_2$ and said reaction temperature is in the range of from about 200° to about 240° C.

4. A method in accordance with claim 1, wherein said adduct is volatilized at a temperature of from about 110° to about 170° C.

5. A method in accordance with claim 1, wherein said adduct is reacted with said titanium and lead precursor sources at a temperature of from about 550° to about 650° C.

6. A method in accordance with claim 1, wherein said carrier gas is $NR_3$ when L is $NR_3$, wherein R is hydrogen or methyl.

7. A method in accordance with claim 1, wherein said carrier gas is $N_2$ when L is $Cl_2$.

* * * * *